United States Patent
Smith et al.

(10) Patent No.: US 9,244,109 B2
(45) Date of Patent: Jan. 26, 2016

(54) CURRENT MEASURING DEVICE AND METHOD

(71) Applicant: Jaguar Land Rover Limited, Coventry (GB)

(72) Inventors: Ian Smith, Coventry (GB); Alexandros Mouzakitis, Coventry (GB)

(73) Assignee: Jaguar Land Rover Limited (GB)

( * ) Notice: Subject to any disclaimer, the term of this patent is extended or adjusted under 35 U.S.C. 154(b) by 0 days.

(21) Appl. No.: 14/371,929

(22) PCT Filed: Jan. 11, 2013

(86) PCT No.: PCT/EP2013/050502
§ 371 (c)(1),
(2) Date: Jul. 11, 2014

(87) PCT Pub. No.: WO2013/104764
PCT Pub. Date: Jul. 18, 2013

(65) Prior Publication Data
US 2014/0350773 A1 Nov. 27, 2014

(30) Foreign Application Priority Data
Jan. 12, 2012 (GB) .................................. 1200494.1

(51) Int. Cl.
*G07C 5/08* (2006.01)
*G01R 31/00* (2006.01)
*B60R 16/02* (2006.01)
*G01R 19/00* (2006.01)

(52) U.S. Cl.
CPC .............. *G01R 31/006* (2013.01); *B60R 16/02* (2013.01); *G07C 5/085* (2013.01); *G01R 19/0092* (2013.01); *G01R 31/007* (2013.01)

(58) Field of Classification Search
CPC combination set(s) only.
See application file for complete search history.

(56) References Cited

U.S. PATENT DOCUMENTS

| | | | |
|---|---|---|---|
| 3,668,470 A * | 6/1972 | Ambler et al. | 361/45 |
| 4,799,126 A * | 1/1989 | Kruse et al. | 361/101 |
| 6,141,202 A | 10/2000 | Maeckel et al. | |
| 2002/0008951 A1 | 1/2002 | Ohta et al. | |
| 2003/0142449 A1 | 7/2003 | Iwata et al. | |
| 2005/0162795 A1 | 7/2005 | Leiber | |

(Continued)

FOREIGN PATENT DOCUMENTS

| CN | 1681688 A | 10/2005 |
|---|---|---|
| CN | 2921842 Y | 7/2007 |

(Continued)

OTHER PUBLICATIONS

Notification of Reasons for Refusal, JP Patent Application No. 2014-551629, Jun. 23, 2015, 2 pages.

(Continued)

*Primary Examiner* — Thomas Tarcza
*Assistant Examiner* — Edward Pipala
(74) *Attorney, Agent, or Firm* — Myers Bigel Sibley & Sajovec

(57) ABSTRACT

In one aspect of the invention there is provided a device comprising electrical connector means adapted releasably to connect the device to an electrical circuit overload protection apparatus of a motor vehicle, the device comprising means for measuring an amount of electrical current flowing therethrough and means for outputting from the device a signal corresponding to the amount of electrical current flowing therethrough.

15 Claims, 2 Drawing Sheets

(56) References Cited

U.S. PATENT DOCUMENTS

| | | |
|---|---|---|
| 2009/0184797 A1 | 7/2009 | Hartzog |
| 2011/0175699 A1 | 7/2011 | Huss et al. |

FOREIGN PATENT DOCUMENTS

| | | |
|---|---|---|
| DE | 41 30 978 A1 | 4/1993 |
| DE | 102 57 589 A1 | 7/2004 |
| DE | 202009002852 U1 | 6/2009 |
| DE | 202010006213 U1 | 6/2011 |
| EP | 1 258 838 A2 | 11/2002 |
| JP | H11120890 A | 4/1999 |
| JP | 2001-045651 A | 2/2001 |
| JP | 2005174595 A | 6/2005 |
| JP | 2005-197104 | 7/2005 |
| JP | 2008-026029 | 2/2008 |
| WO | WO 2012/098396 A1 | 7/2012 |

OTHER PUBLICATIONS

Notification of the First Office Action, CN Patent Application No. 201380012865.3, Aug. 31, 2015, 19 pages.

* cited by examiner

CURRENT MEASURING DEVICE AND METHOD

RELATED APPLICATIONS

This application is a 35 U.S.C. §371 national stage application of PCT Application No. PCT/EP2013/050502, filed on Jan. 11, 2013, which claims priority from Great Britain Patent Application No. 1200494.1, filed Jan. 12, 2012, the contents of which are incorporated herein by reference in their entireties. The above-referenced PCT International Application was published in the English language as International Publication No. WO 2013/104764 A1 on Jul. 18, 2013.

FIELD OF THE INVENTION

The present invention relates to monitoring of motor vehicle electrical systems and to a method of monitoring vehicle electrical systems. Aspects of the invention relate to a device, an apparatus, a motor vehicle, a kit of parts and a method.

BACKGROUND

Motor vehicles typically comprise a number of electrical systems configured to implement critical and non-critical vehicle functions. Electrical systems include the powertrain system (controlled by a powertrain control module, PCM), safety system (controlled by a safety system control module, SCM) and body electrical system (controlled by a body control module, BCM). The modules may communicate with one another by means of a common area network, for example a Controller Area Network (CAN) bus or the like.

Due to package constraints and to aid installation wires associated with vehicle electrical systems may be arranged to follow common paths within a vehicle to connect different components, such as controllers, actuators, switch packs and lighting modules. A relatively large number of cables or wires may follow any given path. The cables are typically bound together forming a cable or wiring assembly or harness. The assembly may also be referred to as a cable or wiring loom. Binding of the cables together has the advantage that it reduces a flexibility of the cables. This may reduce a risk of damage to a cable and aid installation of the cables.

During vehicle development it is known to provide a test station at which a vehicle harness is constructed on a test bench. The harness is connected to actual components that will be connected to the harness in the vehicle, or to modules that simulate such components.

The harness is connected to a test station controller. The controller may monitor signals transmitted by one or more cables of the harness such as a network cable carrying network signals such as CAN bus signals. The controller may also transmit CAN bus signals onto the network cable. The controller may be operable to simulate signals transmitted by any absent control modules or signals transmitted by a control module under certain conditions that cannot otherwise be reproduced at the test station, such as signals transmitted by the powertrain control module when an engine is running.

Some known controllers are operable to run software code arranged to command prescribed control operations by control modules connected to the CAN bus, and to monitor a response of the control modules by monitoring signals transmitted by the modules on the CAN bus. A portion of software code performing a given sequence of control operations may be referred to as a script.

It is an aim of embodiments of the invention to provide improved apparatus for monitoring motor vehicle electrical systems.

STATEMENT OF THE INVENTION

Aspects of the invention provide a motor vehicle, an overload protection element, an electrical circuit overload protection apparatus and a method as claimed in the appended claims.

In one aspect of the invention for which protection is sought there is provided a device comprising electrical connector means adapted releasably to connect the device to an electrical circuit overload protection apparatus of a motor vehicle, the device comprising means for measuring an amount of electrical current flowing therethrough and means for outputting from the device a signal corresponding to the amount of electrical current flowing therethrough.

The device may be operable to measure the amount of current flowing through the device via the electrical connector means.

The device may be operable to limit the amount of electrical current that may flow therethrough.

Optionally the connector means of the device comprises a pair of electrical terminals, the device being operable to limit the amount of current flow therethrough by electrically isolating the pair of terminals from one another thereby to prevent flow of current therebetween.

The device may be operable to limit the amount of current flowing through the device by means of a fusible link, the fusible link being operable to break when an amount of current flowing therethrough exceeds a first value.

The device may be operable to limit the amount of current flowing therethrough by means of a mechanical trip switch, the trip switch being operable to assume an open circuit condition when an amount of current flowing therethrough exceeds a first value.

The device may comprise communications means for communicating the amount of electrical current flowing through the device to an external computing apparatus.

The device may be operable to communicate the amount of electrical current flowing through the device to the external computing apparatus by means of the communications means substantially continuously.

The device may be operable to allow the external computing apparatus to interrogate the device by means of the communications means thereby to determine the amount of current flowing therethrough.

The device may for example allow the computing apparatus to read data stored in a memory thereof when the computing apparatus requires to know the amount of current flowing through the device.

The communications means may comprise at least one selected from amongst a wireless communications module and a cable.

The device may be provided in combination with an electrical circuit overload protection apparatus for connecting the device to an electrical circuit of a motor vehicle, the electrical circuit overload protection apparatus being arranged to allow at least one device to be removably connected thereto.

The electrical circuit overload protection apparatus may be arranged to allow a plurality of devices to be connected in respective electrical circuits of a motor vehicle.

In a further aspect of the invention for which protection is sought there is provided a motor vehicle comprising a device according to the preceding aspect.

In an aspect of the invention for which protection is sought there is provided a method of testing a vehicle comprising:

releasably connecting a device to an electrical circuit overload protection apparatus of a motor vehicle; and measuring by means of the device an amount of electrical current flowing therethrough and outputting from the device a signal corresponding to the amount of electrical current measured.

The method may further comprise limiting by means of the device an amount of electrical current flowing through an electrical circuit of the motor vehicle.

According to another aspect of the invention for which protection is sought there is provided a device comprising electrical connector means adapted releasably to connect to an electrical circuit overload protection apparatus of a motor vehicle and operable to limit an amount of electrical current flowing through an electrical circuit of the motor vehicle, the device comprising means for detecting a flow of electrical current therethrough and means for outputting a signal to computing means responsive to an amount of a flow of electrical current therethrough.

In another aspect of the invention for which protection is sought there is provided a motor vehicle electrical circuit overload protection element connectable to an electrical circuit overload protection apparatus of a motor vehicle, the protection element comprising electrical connector means adapted to connect to an electrical circuit overload protection apparatus, the removable overload protection element being operable to limit an amount of electrical current flowing through an electrical circuit of a motor vehicle, wherein the overload protection element comprises means for detecting a flow of electrical current therethrough and means for outputting a signal to computing means responsive to an amount of a flow of electrical current therethrough.

Embodiments of the invention have the advantage that an amount of electrical current drawn by a given electrical circuit of the vehicle may be monitored without a requirement to disturb a harness or other cable arrangement of a vehicle. Rather, an overload protection element such as fuse or circuit breaker normally fitted in an electrical circuit overload protection apparatus such as a fusebox, a circuit breaker box or the like is simply replaced by an overload protection element according to an embodiment of the invention having current detection functionality. The overload protection element itself provides an output corresponding to flow of current therethrough enabling entirely non-invasive monitoring of electrical currents.

This feature is advantageous in that it allows a status of a vehicle electrical circuit to be monitored independently of network traffic monitoring. Thus if an electrical control module provides an erroneous indication that it is inactive when in fact it is active, measurement of an amount of current drawn by a circuit associated with the controller automatically by means of an overload protection element according to an embodiment of the present invention becomes an invaluable tool, enabling confirmation to be obtained as to whether or not the module is inactive based on the amount of current drawn by the module.

It is to be understood that an electrical control module may provide an erroneous indication in respect of its operational state for example if it is silent on a CAN bus or outputs a CAN message indicating it is in a shutdown mode when in fact the module is active. By measuring an amount of current drawn by a module, a more accurate assessment of an operational state of a module may be made. Thus if a module is drawing an amount of current that exceeds that which would be expected of a module in a standby state, when CAN signals indicate that the module is in the standby state, it may be determined that the module may not in fact be in the standby state.

Embodiments of the invention are useful in diagnosing the origin of unintended operational features of motor vehicles such as production motor vehicles. A vehicle may be fitted with an overload protection element according to an embodiment of the present invention and be subject to automated testing wherein currents flowing through vehicle electrical circuits substantially as installed in the production vehicle are measured.

A requirement to modify a cable harness of the vehicle or to change an environment in which the harness operates (for example by removal of the harness from a vehicle for bench top testing) is therefore substantially eliminated. Thus a harness can be tested whilst it remains in-situ, substantially as installed in the production vehicle. This increases substantially a likelihood that any features associated with vehicle operation that are not well understood prior to testing may be reproduced under the control of the control means and the origin determined.

Advantageously, the electrical connector means may comprise at least a pair of terminals connectable to corresponding terminals of an electrical circuit overload protection apparatus, the element being operable to measure an amount of current flowing through the element between the terminals.

Conveniently, the element may be operable to limit an amount of current therethrough by electrically isolating the first and second terminals from one another thereby to prevent flow of current therebetween.

The element is optionally operable to limit an amount of current therethrough by means of a fusible link, the fusible link being operable to break when an amount of current therethrough exceeds a prescribed value.

Alternatively, or in addition, the element may be operable to limit an amount of current therethrough by means of a mechanical trip switch, the trip switch being operable to open when an amount of current therethrough exceeds a prescribed value.

Advantageously, the element may comprise communications means for communicating an amount of electrical current flowing through the element to an external computing device.

The communications means may be operable to communicate an amount of electrical current by means of a wireless communications module of the element. Alternatively, or in addition, the communications means is operable to communicate an amount of electrical current by means of a network cable.

In another aspect of the invention for which protection is sought there is provided an element according to the preceding aspect of the invention in combination with an electrical circuit overload protection apparatus.

In a further aspect of the invention there is provided a motor vehicle comprising electrical circuit overload protection apparatus according to the preceding aspect.

In another aspect of the invention for which protection is sought there is provided a method of testing a vehicle comprising:

connecting electrically a removable overload protection element in a motor vehicle electrical circuit overload protection apparatus;

detecting a flow of electrical current through the element and outputting from the element a signal responsive to an amount of a flow of electrical current therethrough; and limiting an amount of current flowing through the element in the event an amount of current flowing through the element exceeds a prescribed value.

Within the scope of this application it is expressly intended that the various aspects, embodiments, examples and alternatives set out in the preceding paragraphs, in the claims and/or in the following description and drawings, and in particular the individual features thereof, may be taken independently or in any combination. Features described in connection with one embodiment are applicable to all embodiments, unless such features are incompatible.

BRIEF DESCRIPTION OF THE DRAWINGS

Embodiments of the invention will now be described, by way of example only, with reference to the accompanying figures in which.

DETAILED DESCRIPTION

Figure 1:
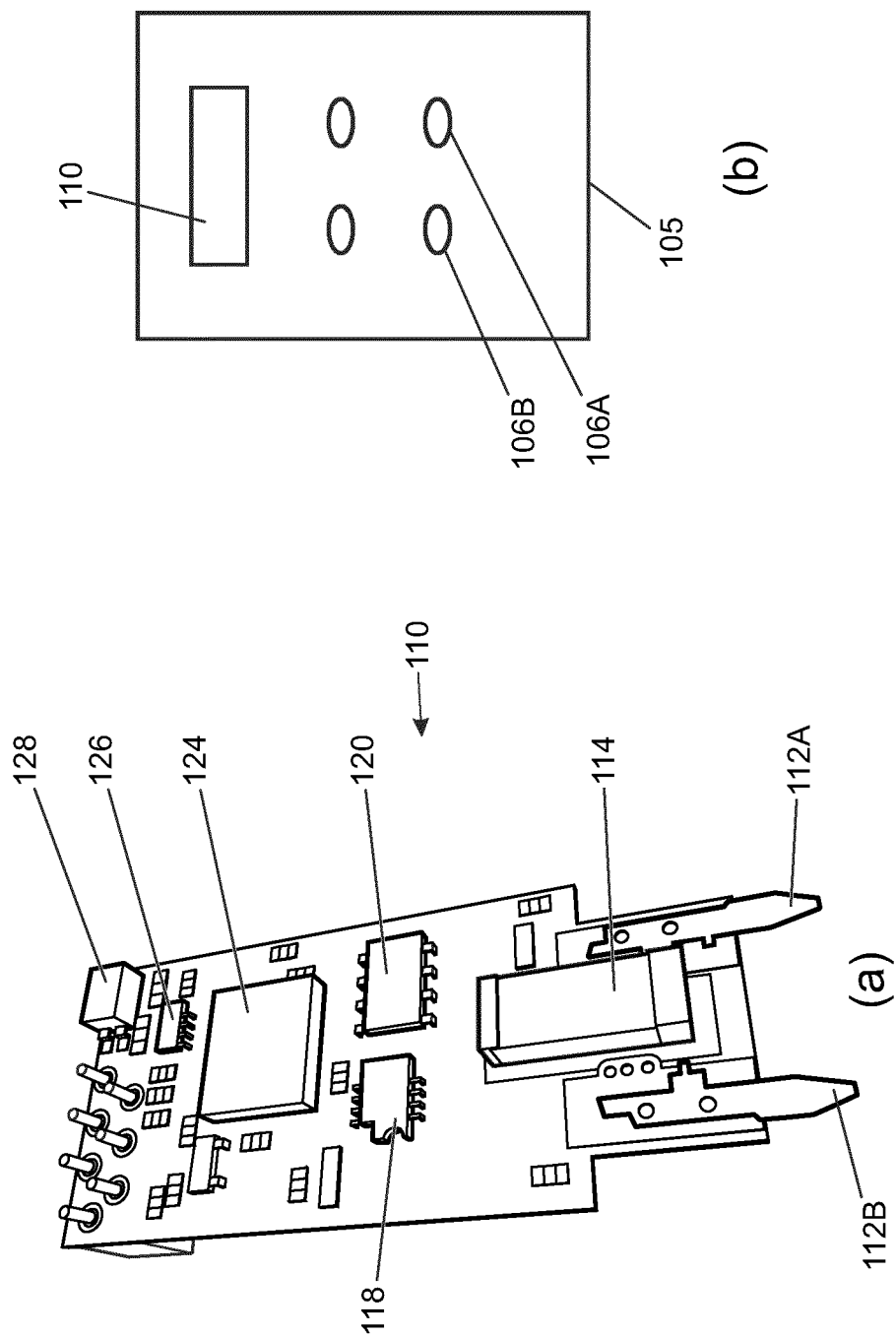
FIG. 1 shows (a) a perspective view of a removable overload protection element according to an embodiment of the present invention and (b) a plan view of a fusebox of a motor vehicle.

FIG. 1(a) shows an overload protection element 110 according to an embodiment of the present invention. The element 110 has a pair of terminal blades 112A, 112B adapted to fit into corresponding sockets of a fusebox 105 of a motor vehicle as shown in FIG. 1(b). The element 110 is adapted to replace fuses of the blade type commonly installed in motor vehicle fuse boxes 105 to protect electrical circuits of the vehicle. FIG. 1(b) shows an element 110 installed in a fusebox and sockets 106A, 106B configured to receive respective blades 112A, 112B of the element 110.

Figure 2:
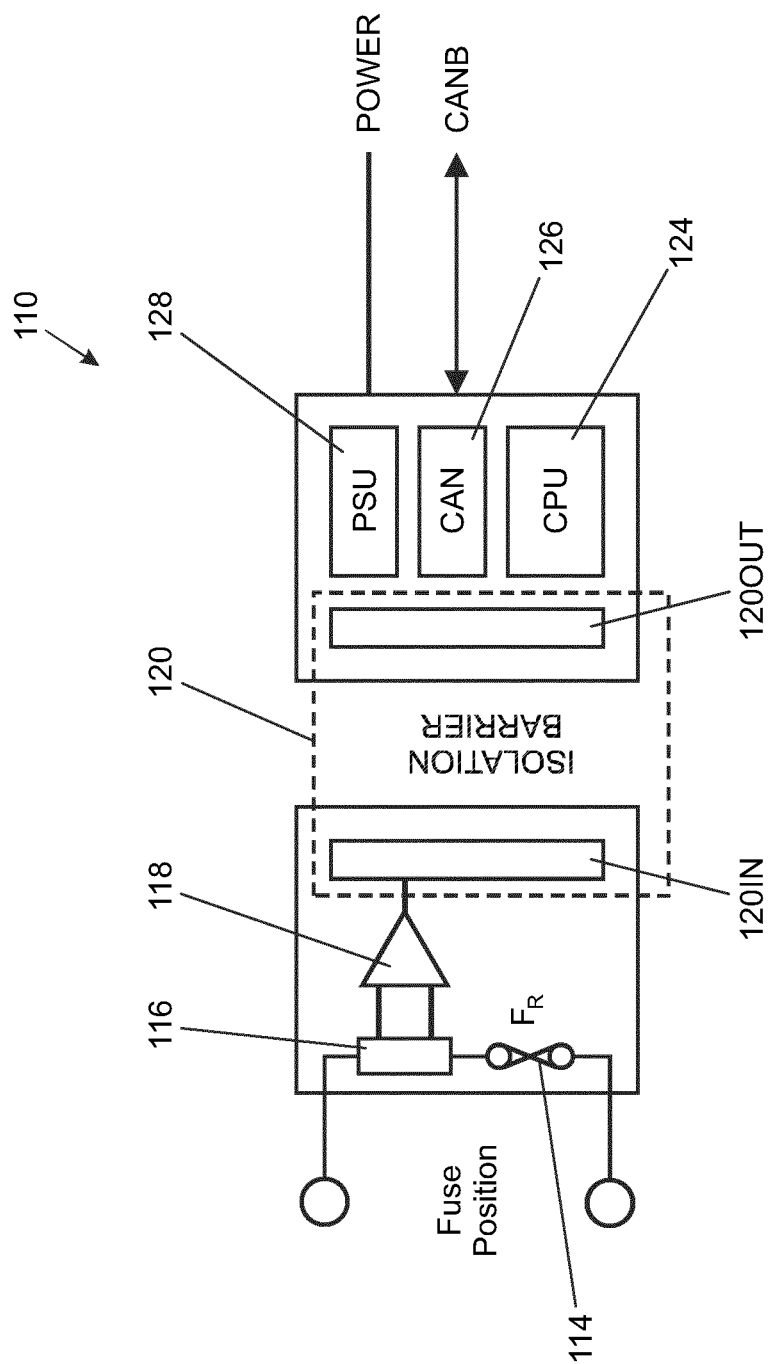
FIG. 2 is a schematic circuit diagram of the removable overload protection element of FIG. 1.

The element 110 has a fusible link 114 therein that is electrically coupled between the terminal blades 112A, 112B as shown in the circuit diagram of FIG. 2. Electrical current flowing through the element 110 is forced to flow through the fusible link 114. The fusible link is arranged wherein if an amount of current flowing through the link 114 exceeds a prescribed value the link will break, preventing further current flow through the element between the terminal blades 112A, 112B.

In series with the fusible link 114 is provided a resistive element 116 (FIG. 2). A comparator 118 is connected in parallel with the resistive element 116 and arranged to measure a potential difference across the resistive element 116. An output from the comparator 118 is connected to an input 120IN of an opto-isolator module 120. An output 120OUT of the module 120 is coupled to a main controller 124 of the element 110.

The opto-isolator module 120 is arranged to transmit between its input and output 120IN, 120OUT (which are in electrical isolation from one another) an optical signal corresponding to a magnitude of the current flowing through the element 110 between the terminal blades 112A, 112B. The main controller 124 receives the output of the module 120OUT (which corresponds to the amount of current flowing through the element 110). The main controller 124 transmits via communications controller 126 a signal indicative of the amount of current flowing through the element 110 to a network to which the element 110 is connected. Power to the main controller 124, communications controller 126 and output side of the opto-isolator module 120 is provided by a power supply unit 128 of the element 110. The power supply unit 128 in turn draws power from an external supply.

The presence of the opto-isolator module 120 reduces a risk that current flowing through the element 110 between the terminal blades 112A, 112B passes to the main controller 124 causing electrical damage thereto.

Power for the comparator 118 and input side of the opto-isolator module 120 is drawn from current flowing through the element 110 between the terminal blades 112A, 112B.

Thus the comparator 118 and input side of the opto-isolator module 120 are only powered when current is flowing through the electrical circuit of the vehicle in which the blades 112A, 112B connect the element 110. A risk that a battery of a vehicle becomes excessively discharged due to installation of one or more overload protection elements 110 is therefore reduced since current will not be drawn by the element 110 unless a circuit is already active. It is to be understood that an amount of current drawn by the element 110 is arranged to be relatively small.

It is to be understood that other arrangements are also useful.

Embodiments of the present invention are useful in allowing direct monitoring of vehicle electrical loads independently of indirect monitoring methods. Indirect monitoring may take place for example by monitoring vehicle control or other communications signals. In the event that one or more vehicle communications signals erroneously identify an operational state of one or more components, independent verification by means of an overload protection element according to an embodiment of the present invention can enable an investigator to identify the erroneous data as erroneous.

Furthermore, because measurement of current flow is made by means of a fusebox, it is not necessary to tamper with a harness or other component of a vehicle in order to make a measurement of current flow. This reduces a financial and time cost associated with vehicle testing. In addition, this reduces a risk that tampering with the harness or other component introduces a further feature of vehicle operation or changes a pre-existing feature, making it difficult to characterise and understand the pre-existing feature.

In some embodiments, the overload protection element 110 may be provided with a radio transmitter module operable to transmit data corresponding to the amount of current flowing through the element 110. The transmitted data may be received by a test or monitoring apparatus and logged in a memory thereof. Other arrangements are also useful.

Embodiments of the invention may be understood by reference to the following numbered paragraphs:

1. A device comprising an electrical connector adapted releasably to connect the device to an electrical circuit overload protection apparatus of a motor vehicle,
the device being operable to measure an amount of electrical current flowing therethrough, the device being further operable to output from the device a signal corresponding to the amount of electrical current flowing therethrough.

The device may for example comprise a current measuring circuit configured to measure the amount of current flowing through the device.

2. A device as described in paragraph 1 operable to measure the amount of current flowing through the device via the electrical connector.

3. A device as described in paragraph 1 operable to limit the amount of electrical current that may flow therethrough.

4. A device as described in paragraph 3 wherein the connector comprises a pair of electrical terminals, the device being operable to limit the amount of current flow therethrough by electrically isolating the pair of terminals from one another thereby to prevent flow of current therebetween.

5. A device as described in paragraph 3 operable to limit the amount of current flowing through the device by means of a fusible link, the fusible link being operable to break when an amount of current flowing therethrough exceeds a first value.

6. A device as described in paragraph 3 operable to limit the amount of current flowing therethrough by means of a mechanical trip switch, the trip switch being operable to assume an open circuit condition when an amount of current flowing therethrough exceeds a first value.

7. A device as described in paragraph 1 operable to communicate the amount of electrical current flowing through the device to an external computing apparatus.

8. A device as described in paragraph 7 operable to communicate the amount of electrical current flowing through the device to the external computing apparatus substantially continuously.

9. A device as described in paragraph 7 operable to allow the external computing apparatus to interrogate the device thereby to determine the amount of current flowing therethrough.

The device may for example allow the computing apparatus to read data stored in a memory thereof when the computing apparatus requires to know the amount of current flowing through the device.

10. A device as described in paragraph 7 comprising at least one selected from amongst a wireless communications module and a cable for communicating the amount of electrical current flowing through the device to an external computing apparatus.

11. A device as described in paragraph 1 in combination with an electrical circuit overload protection apparatus for connecting the device to an electrical circuit of a motor vehicle, the electrical circuit overload protection apparatus being arranged to allow at least one device to be removably connected thereto.

12. A device as described in paragraph 11 wherein the electrical circuit overload protection apparatus is arranged to allow a plurality of devices to be connected in respective electrical circuits of a motor vehicle.

13. A motor vehicle comprising a device as described in paragraph 1.

14. A method of testing a vehicle comprising:
releasably connecting a device to an electrical circuit overload protection apparatus of a motor vehicle; and
measuring by means of the device an amount of electrical current flowing therethrough and outputting from the device a signal corresponding to the amount of electrical current measured.

15. A method as described in paragraph 14 comprising limiting by means of the device an amount of electrical current flowing through an electrical circuit of the motor vehicle.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. A motor vehicle, comprising:
a current measuring device comprising an electrical connector adapted to releasably connect the current measuring device to an electrical circuit overload protection apparatus of the motor vehicle, the electrical circuit overload protection apparatus being arranged to allow at least one current measuring device to be removably connected thereto, wherein the current measuring device is configured to measure an amount of electrical current flowing therethrough and,
a communications controller configured to output from the current measuring device a signal corresponding to the amount of electrical current flowing therethrough,
the vehicle being configured to determine whether a vehicle communications signal indicative of an operational state of one or more components of a motor vehicle is erroneous in dependence on the signal corresponding to the amount of electrical current flowing through the current measuring device.

2. The motor vehicle of claim 1, wherein the current measuring device is operable to measure the amount of current flowing through the device via the electrical connector.

3. The motor vehicle of claim 1, wherein the current measuring device is operable to limit the amount of electrical current that may flow therethrough.

4. The motor vehicle of claim 3, wherein the electrical connector comprises a pair of electrical terminals, the current measuring device being operable to limit the amount of current flow therethrough by electrically isolating the pair of terminals from one another thereby to prevent flow of current therebetween.

5. The motor vehicle of claim 3, wherein the current measuring device is operable to limit the amount of current flowing through the device via a fusible link, the fusible link being operable to break when an amount of current flowing therethrough exceeds a first value.

6. The motor vehicle of claim 3, wherein the current measuring device is operable to limit the amount of current flowing therethrough via a mechanical trip switch, the trip switch being operable to assume an open circuit condition when an amount of current flowing therethrough exceeds a first value.

7. The motor vehicle of claim 1, wherein the electrical circuit overload protection apparatus is configured to communicate the amount of electrical current flowing through the device to an external computing apparatus.

8. The motor vehicle of claim 7, operable to communicate the amount of electrical current flowing through the device to the external computing apparatus substantially continuously.

9. The motor vehicle of claim 7, operable to allow the external computing apparatus to interrogate the device to determine the amount of current flowing therethrough.

10. The motor vehicle of claim 7 wherein the electrical circuit overload protection apparatus is configured to communicate via a wireless communications module and/or a cable.

11. The motor vehicle of claim 1, in combination with an electrical circuit overload protection apparatus for connecting the current measuring device to an electrical circuit of a motor vehicle, the electrical circuit overload protection apparatus being arranged to allow at least one device to be removably connected thereto.

12. The motor vehicle of claim 11, wherein the electrical circuit overload protection apparatus is arranged to allow a plurality of respective current measuring devices to be connected in respective electrical circuits of the motor vehicle.

13. The motor vehicle of claim 1, configured to provide an output indicative of whether a vehicle communications signal indicative of an operational state of one or more components of the motor vehicle is erroneous.

14. A method of testing a vehicle comprising:
- releasably connecting a current measuring device to an electrical circuit overload protection apparatus of a motor vehicle;
- measuring, via the current measuring device, an amount of electrical current flowing therethrough and outputting from the device a signal corresponding to the amount of electrical current measured; and
- determining whether a vehicle communications signal indicative of an operational state of one or more components of the motor vehicle is erroneous in dependence on the signal corresponding to the amount of electrical current flowing through the current measuring device.

15. The method of claim 14, further comprising limiting via the current measuring device an amount of electrical current flowing through an electrical circuit of the motor vehicle.

* * * * *